(12) United States Patent
Ueno (10) Patent No.: US 6,238,980 B1
(45) Date of Patent: May 29, 2001

(54) METHOD FOR MANUFACTURING SILICON CARBIDE MOS SEMICONDUCTOR DEVICE INCLUDING UTILIZING DIFFERENCE IN MASK EDGES IN IMPLANTING

(75) Inventor: Katsunori Ueno, Kanagawa (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 09/343,843

(22) Filed: Jun. 30, 1999

(30) Foreign Application Priority Data

Jul. 7, 1998 (JP) .................................. 10-191486

(51) Int. Cl.$^7$ .................................. H01L 21/336
(52) U.S. Cl. .................. 438/268; 438/269; 438/285; 438/306
(58) Field of Search .................. 438/93, 153, 192, 438/206, 268, 269, 272, 285, 547, 306, 276, 279; 148/DIG. 143

(56) References Cited

U.S. PATENT DOCUMENTS

| | | | |
|---|---|---|---|
| 5,429,964 | * 7/1995 | Yilmaz .................................. | 438/268 |
| 5,475,252 | * 12/1995 | Merrill et al. ........................ | 257/341 |
| 5,545,908 | * 8/1996 | Tokura et al. ........................ | 257/341 |
| 6,049,104 | * 4/2000 | Hshieh et al. ........................ | 257/328 |

OTHER PUBLICATIONS

"High–Voltage Double–Implanted Power Mosfet's in 6H–SiC", IEEE Electron Device Letters, vol. 18, No. 3. Mar. 1997, by Shenoy, Cooper, and Melloch, pp. 93–95.

"1100V 4H–SiC Power Mosfets", by Aqarwal, Casady, Rowland, Valek, and Brandt, Apr. 11, 1997 to International Conference on Silicon Carbide, III–nitrides and Related Materials–1997, Aug. 31–Sep. 5, 1997 Sweden. pp. 156–157.

\* cited by examiner

Primary Examiner—Wael Fahmy
Assistant Examiner—William M. Brewster
(74) Attorney, Agent, or Firm—Rossi & Associates (57) ABSTRACT

A method for manufacturing a SiC semiconductor device is provided in which a first conductivity type source region is formed by implanting impurity ions, using a mask provided by a pattern of an oxide film formed by thermally oxidizing a patterned polysilicon film, and a second-conductivity type base region is formed by implanting impurity ions, using a mask provided by a pattern of a polysilicon film from which the above oxide film is removed. Since the edge of the mask for forming the base region is located behind that of the mask for forming the source region due to the oxidation process, the second conductivity type base region and first conductivity type source region provide self-aligned impurity regions with uniform channel regions. Also, a polysilicon film that provides a gate electrode layer of the semiconductor device is subjected to thermal oxidation, so that the resulting oxide film provides an interlayer insulating film on the gate electrode layer.

26 Claims, 5 Drawing Sheets

METHOD FOR MANUFACTURING SILICON CARBIDE MOS SEMICONDUCTOR DEVICE INCLUDING UTILIZING DIFFERENCE IN MASK EDGES IN IMPLANTING

FIELD OF THE INVENTION

The present invention relates to a method for manufacturing silicon carbide MOS semiconductor devices, such as MOS field-effect transistors (hereinafter referred to as "MOSFET"), having a MOS type gate of metal-oxide-semiconductor structure, which use silicon carbide as a semiconductor material and serve as power semiconductor devices. The invention also relates to such silicon carbide MOS semiconductor devices.

BACKGROUND OF THE INVENTION

Silicon carbide (hereinafter referred to as "SiC") has a wide band gap, and its maximum breakdown electric field is larger than that of silicon (hereinafter referred to as "Si") by one order of magnitude. Thus, SiC has been highly expected to be used as a material for power semiconductor devices in the next generation. Up to the present, various types of electron devices, in particular, those for switching large power at high temperatures, have been developed, using single-crystal wafers, such as 4H—SiC and 6H—SiC. These crystals are alpha-phase SiC in which a zinc-blend structure and a wurtzite structure are superposed on each other. Also, some semiconductor devices have been fabricated using crystals of beta-phase SiC, such as 3C—SiC. Recently, power devices, such as Schottky diodes, vertical MOSFET, and thyristors, and CMOS-IC as the most typical semiconductor devices, have been fabricated using SiC as a semiconductor material, and it has been confirmed that these devices exhibit far better characteristics than conventional Si semiconductor devices.

The present invention relates to a MOS semiconductor device having a MOS type gate. Some examples of known Si MOSFET and SiC MOSFET will be now described.

Figure 4:
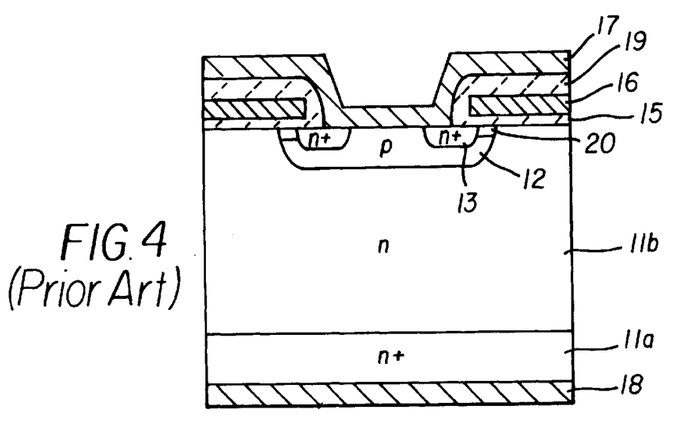
FIG. 4 is a cross-sectional view showing a part of a known Si vertical MOSFET.

FIG. 4 is a cross-sectional view of a unit cell of typical Si vertical MOSFET that has been generally used as a power semiconductor device. In the Si vertical MOSFET of FIG. 4, an n drift layer 11b having a high resistivity is laminated on an n$^+$ drain layer 11a, and a p base region 12 is formed in a selected area of a surface layer of the n drift layer 11b, while an n$^+$ source region 13 is formed within the p base region 12. A gate electrode layer 16 made of polycrystalline silicon or polysilicon is formed on a gate insulating film 15, over the surface of the p base region 12 interposed between the n$^+$ source region 13 and an exposed surface portion of the n drift layer 11b. A source electrode 17 is formed in contact with surfaces of both of the n$^+$ source region 13 and p base region 12, and a drain electrode 18 is formed on the n$^+$ drain layer 11a on the rear surface of the n drift layer 11b. As shown in FIG. 4, the source electrode 17 is often extended over the gate electrode layer 16 via an interlayer insulating film 19. A gate electrode made of metal is held in contact with the gate electrode layer 16 at a portion that is not illustrated in the figure.

In the operation of the vertical MOSFET as described above, when a positive voltage is applied to the gate electrode, an inversion layer appears in a channel region 20, namely, a surface layer of the p base region 12 located right under the gate electrode layer 16, so that current flows between the source electrode 17 and the drain electrode 18 through the inversion layer. If the positive voltage stops being applied to the gate electrode, the inversion layer of the channel region 20 disappears, and the current stops flowing through the channel region 20.

Thus, the channel region 20 plays an important role in the above operation, and its length is desired to be strictly or accurately controlled. To this end, a method called diffusion self alignment (that may be abbreviated to DSA) is employed in the manufacture of Si MOSFET, and the resulting MOSFET may be called double diffusion MOSFET.

Main process steps for manufacturing the double diffusion MOSFET will be now described, referring to the cross-sectional views of FIG. 5(a) through FIG. 5(f) showing the respective steps.

Figure 5A:
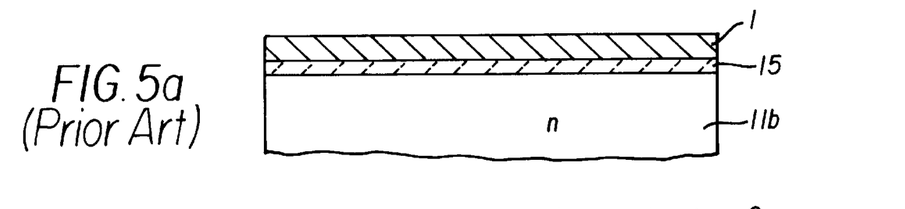
FIG. 5(a) through FIG. 5(f) are cross-sectional views showing the process steps for manufacturing the known Si vertical MOSFET of FIG. 4.

In the step of FIG. 5(a), an n drift layer 11b having a high resistivity is laminated on an n$^+$ drain layer 11a by epitaxial growth, to provide a Si wafer, which is then subjected to thermal oxidation so that a gate oxide film 15 is formed on the n drift layer 11b. Thereafter, a polysilicon film 1 is deposited on the gate oxide film 15 by low-pressure CVD method.

Figure 5B:
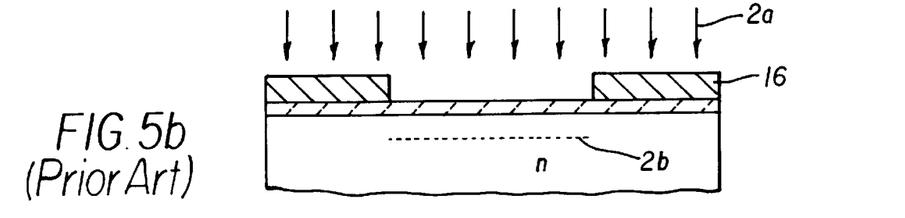
Figure 5C:
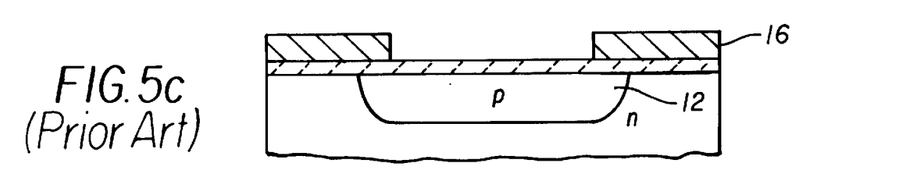

In the next step of FIG. 5(b), the polysilicon film 1 is patterned by photolithography, to thus form a gate electrode layer 16, and boron ions 2a, or the like, for forming a p base region 12 are implanted, using the gate electrode layer 16 as a mask. In FIG. 5(b), reference numeral 2b denotes boron atoms thus implanted. Thereafter, heat treatment is conducted so as to form the p base region 12, as shown in FIG. 5(c).

Figure 5D:
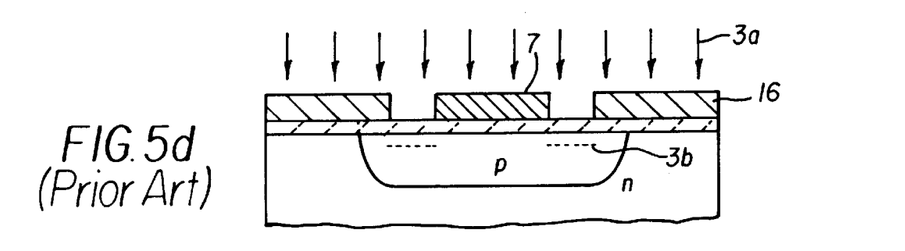
Figure 5E:
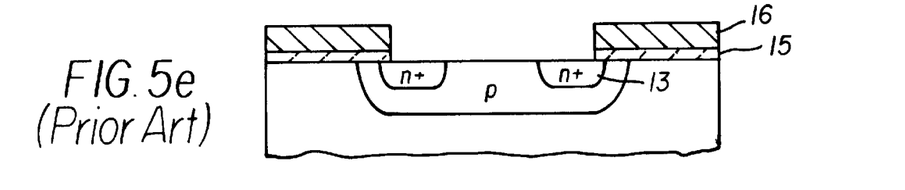

In the next step of FIG. 5(d), arsenic ions 3a, for example, for forming an n$^+$ source region 13 are implanted, using the gate electrode layer 16 and a photoresist 7 as masks. In FIG. 5(c), reference numeral 3b denotes arsenic atoms thus implanted. Thereafter, heat treatment is conducted again, so as to form the n$^+$ source region 13, as shown in FIG. 5(e).

Figure 5F:
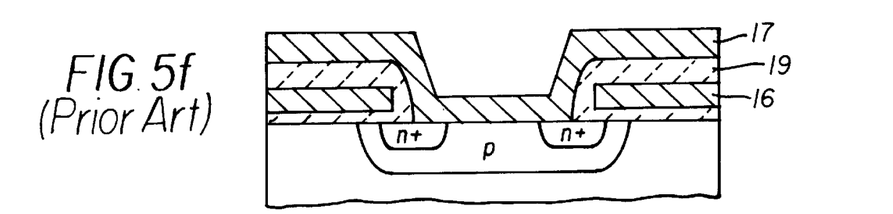

In the next step of FIG. 5(f), boron/phosphorous/silica glass (BPSG) is deposited on the structure by plasma CVD method, to provide an interlayer insulating film 19, and a window or hole is formed through the insulating film 19 by photolithography. A metal that provides an electrode is deposited on the Si substrate, and patterned so as to form a source electrode 17 and others, as shown in FIG. 5(f). Thereafter, a drain electrode (not illustrated) is formed on the rear surface of the Si substrate, and the manufacturing process is completed.

While a high-concentration p$^+$ well region that overlaps the p base region 12 may be provided in the structure of FIG. 5, such a p$^+$ well region can be formed by implanting impurity ions using the gate electrode layer 16 and photoresist as used for forming the n$^+$ source region 13, and then conducting heat treatment.

What is important in the above process is that the polysilicon film 1 that provides the gate electrode layer 16 is used as a mask during ion implantation for forming the p base region 12 and the n$^+$ source region 13. Since the p base region 12 and n$^+$ source region 13 use the same mask, there arises no variations in the position of the mask, and the dimensions of the channel region 20 formed in a portion of the p base region 12 right below the gate electrode layer 16 are accurately and uniformly controlled due to lateral diffusion of impurities during formation of the p base region 12 and n$^+$ source region 13.

The channel dimensions that influence the characteristics of the MOSFET can be controlled with high accuracy by introducing p type impurities and n type impurities into selected regions using the same mask, and causing thermal diffusion. Thus, the diffusion self alignment method (DSA method) makes it possible to produce high performance MOSFET with a high yield.

On the other hand, SiC is a semiconductor material that is highly expected to be applied to power devices in the future, and its important applications include vertical MOSFET. For example, trench type or planar type vertical MOSFETs have been fabricated using SiC.

Figure 6:
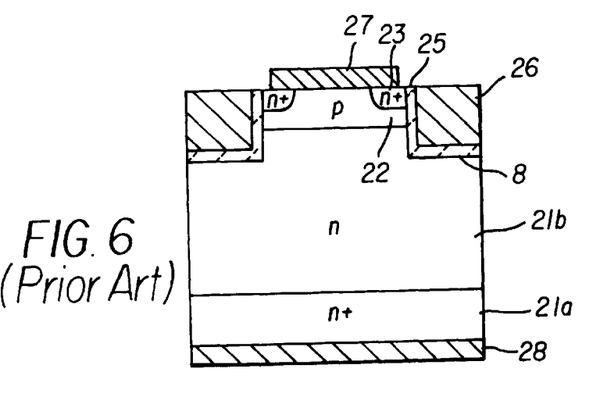
FIG. 6 is a cross-sectional view of a known SiC vertical UMOSFET.

FIG. 6 is a cross-sectional view showing a part of a unit cell of SiC vertical UMOSFET as one example of MOSFET (as disclosed in Weitzel, C. W. et al.: IEEE Trans. on Electron Devices, vol. 43, No. 10, pp. 1732–1741 (1996), Agarwal, A. K. et al: Abstract of Int. Conf. Silicon Carbide, III-nitrides and Related Materials (1997) pp. 156–157).

In the SiC vertical UMOSFET, an n drift layer 21b and a p base layer 22 are laminated on an $n^+$ drain layer 21a, and an $n^+$ source region 23 is formed in a surface layer of the p base layer 22. A trench 8 that extends from the surface of the $n^+$ source region 23 down into the n drift layer 21b is provided, and a gate electrode layer 26 is embedded in the trench 8, with a gate insulating film 25 interposed between the electrode layer 26 and the wall of the trench 8. A source electrode 27 is formed in contact with both of the $n^+$ source region 23 and p base layer 22, and a drain electrode 28 is formed on the rear surface of the $n^+$ drain layer 21. Also, a gate electrode made of metal is formed in contact with the gate electrode layer 26 at a portion that is not illustrated in the figure.

With this arrangement, when a voltage is applied to the gate electrode, an inversion layer appears in a surface layer of the p base layer 22 that faces the gate electrode layer 26, and current flows between the source electrode 27 and the drain electrode 28 through the inversion layer. By removing the voltage applied to the gate electrode, current flow between the drain electrode 28 and the source electrode 27 is cut off or interrupted, thus showing a switching function.

Since it is considerably difficult to form deep impurity regions in the SiC substrate utilizing thermal diffusion, a large number of UMOSFETs of the above type in which the gate electrode layer 26 is embedded in the trench 8 have been fabricated.

Figure 7:
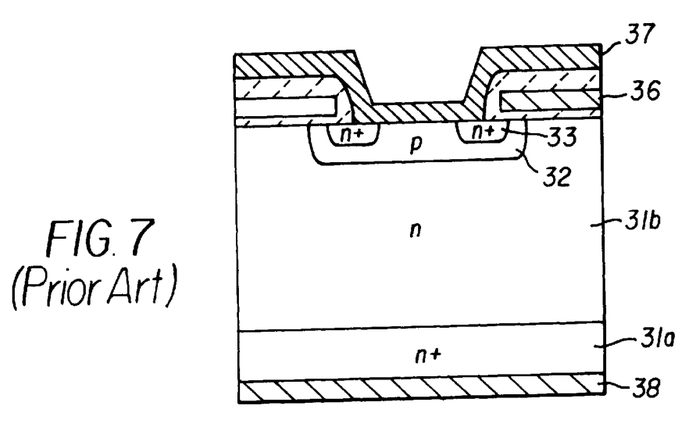
FIG. 7 is a cross-sectional view of a known SiC vertical MOSFET.

FIG. 7 shows one example of planar type SiC vertical MOSFET having no trench (as disclosed in Shenoy, J. N. et al: IEEE Electron Device Lett. Vol. 18, No. 3, pp.93–95 (1997)).

In the planar type SiC vertical MOSFET, an n drift layer 31b is laminated on an $n^+$ drain layer 31, and a p base region 32 is formed in a surface layer of the n drift layer 31b by implanting ions at a high acceleration voltage. An $n^+$ source region 33 is formed in a surface layer of the p base region 32. A gate electrode layer 36 is formed on a gate insulating film 35, over the surface of the p base region 32 that is interposed between the n drift layer 31b and the $n^+$ source regions 33. A source electrode 27 is formed on the surfaces of the $n^+$ source region 33 and p base region 32, and a drain electrode 38 is formed on the rear surface of the $n^+$ drain layer 31 a.

In this example, the p base region 32 having a large junction depth is formed through ion implantation with a high acceleration voltage, and the length of a channel region 40 is controlled using two types of mask, i.e., a mask for ion implantation for forming the p base region 32, and a mask for ion implantation for forming the $n^+$ source region 33.

In the operation of the MOSFET of the above type, when a positive voltage is applied to the gate electrode, an inversion layer is induced in a surface portion of the n channel region 40 right below the gate electrode layer 36, so as to allow current to flow from the drain electrode 38 to the source electrode 37.

Although the SiC vertical MOS semiconductor devices are expected to exhibit remarkably excellent characteristics, actual SiC devices have not achieved such excellent characteristics, or such devices have not been actually manufactured. One of the reasons is that the self alignment process that enables fine dimension control has not been developed in the process of manufacturing the SiC devices, and accurate control of the channel density has not been realized.

In Si substrates, p type impurities and n type impurities are introduced into selected regions using the same mask, and then thermally diffused so as to achieve a desired channel density with high accuracy. Namely, the dimensions of channels that greatly influence the characteristics of MOSFET can be controlled with high accuracy, thus assuring a high yield in the manufacture of MOSFET.

On the other hand, impurities introduced into SiC by ion implantation hardly diffuse, and therefore the double diffusion MOS (D-MOS) structure as employed in the Si devices cannot be easily realized in the SiC devices, thus making it difficult to control the channel density with high accuracy. Since p type impurities and n type impurities are introduced using separate or respective masks, the resulting SiC MOSFET has large channel resistance with considerably large variations. The ON resistance of the device as a whole is mostly determined by the channel resistance, and thus the SiC devices fabricated so far have not taken advantage of inherent characteristics of SiC as expected.

The impurities introduced into SiC through ion implantation are less likely to be activated, namely, the impurities thus introduced have a poor activation rate. In order to improve the activation rate, the ion implantation needs to be conducted at a high temperature of 1000° C. or higher, and therefore a resist cannot be used as a mask for ion implantation. Also, heat treatment for activating the implanted impurities needs to be conducted at a high temperature of 1500° C. or higher, thus causing a problem that oxide films and polysilicon cannot withstand the heat treatment.

SUMMARY OF THE INVENTION

It is therefore an object of the present invention to provide a method for manufacturing silicon carbide vertical MOS semiconductor devices having high breakdown voltage, and including channels whose dimensions are controlled with considerably high accuracy. It is another object of the invention to provide such silicon carbide MOS semiconductor devices.

To accomplish the above object, the present invention provides a method for manufacturing a silicon carbide MOS semiconductor device, comprising the steps of: laminating a first conductivity type drift layer comprising silicon carbide, on a silicon carbide substrate; forming a second conductivity type base region in a selected portion of a surface layer of the first conductivity type drift layer, using a first mask, the second conductivity type base region comprising mutually spaced portions; forming a first conductivity type source region in a selected portion of the second conductivity type base region, using a second mask; forming a gate electrode layer on a gate insulating film, over a surface of the second conductivity type base region that is interposed between the first conductivity type source region and an exposed surface portion of the first conductivity type drift layer; forming a source electrode in contact with surfaces of both of the first conductivity type source region and the second conductivity type base region; and forming a drain electrode on a rear surface of the silicon carbide substrate; wherein each of the first mask and the second mask used for forming the second conductivity type base region and the first conductivity type source region, respectively, comprises a polysilicon film or an oxide film thereof, and the second conductivity type base region and said first conductivity type source region being positioned with respect to each other, utilizing a difference in the position of edges of the first and second masks due to oxidation or removal of the oxide film.

In the method as described above, the first mask may consist of a polysilicon film, and the second mask may consist of an oxide film formed by oxidizing the polysilicon film after introducing impurities using the first mask. In this case, the edge of the mask is advanced, namely, the edge of the second mask is located ahead of that of the first mask, since oxidation takes place in the lateral direction as well as the vertical direction. Where the first mask consists of a polysilicon film, which is oxidized after introducing impurities using the mask, and the second mask consists of the polysilicon film from which the oxide film has been removed, the edge of the second mask is located behind that of the first mask. If the first mask consists of an oxide film formed by oxidizing a polysilicon film, and the second mask consists of the polysilicon film from which the oxide film has been removed, the edge of the second mask is located behind that of the first mask. Thus, the amount of movement or shift of the edge of the mask (i.e., a difference in the position of the edges of the first and second masks) is constant, and self-aligned impurity regions can be formed by utilizing the shift in the position of the edge of the mask, without requiring a special photolithography process.

More specifically, different impurity regions may be formed by executing at least two of ion implantation steps, which include ion implantation using a pattern of a polysilicon film as a mask; ion implantation using, as a mask, a pattern of an oxide film formed by oxidizing the patterned polysilicon film; ion implantation using, as a mask, a pattern of a polysilicon film from which an oxide film formed by oxidizing the patterned polysilicon film has been removed, and ion implantation using, as a mask, a pattern of a polysilicon film or an oxide film of the polysilicon film for which oxidation and removal of an oxide film have been repeated. By employing at least two of the above ion implantation steps, at least two impurity regions that are completely self-aligned can be formed.

One specific example of manufacturing method according to the present invention may comprises the steps of: epitaxially growing a first conductivity type drift layer comprising silicon carbide, on a silicon carbide substrate, to provide a silicon carbide substrate; forming a first mask comprising a first polysilicon film on a surface of the first conductivity type drift layer, and implanting impurity ions in a selected portion of the first conductivity type drift layer, using the first mask; forming a second mask comprising an oxide film formed by oxidizing the first mask, and implanting impurity ions in a selected portion of the first conductivity type drift layer, using the second mask; removing the first mask and the second mask; conducting heat treatment for activating implanted impurities; forming a gate oxide film on a surface of the silicon carbide substrate through thermal oxidation; depositing a second polysilicon film on the gate oxide film and then patterning the second polysilicon film to provide a gate electrode layer; covering the second polysilicon film with an insulating film; forming a contact hole through the insulating film, and vapor-depositing a metallic film so as to provide a gate electrode that contacts with the second polysilicon film; and forming a source electrode in contact with a surface of at least one of impurity regions formed by ion implantation, and a drain electrode in contact with the silicon carbide substrate. This method makes it possible to produce a silicon carbide vertical MOS semiconductor device including two self-aligned impurity regions, using the first mask in the form of a polysilicon film, and the second mask in the form of an oxide film formed by oxidizing the polysilicon film of the first mask.

Various other combinations of the first and second masks may be employed. For example, the first mask in the form of a polysilicon film may be combined with the second mask in the form of a polysilicon film from which an oxide film formed by oxidizing the first mask has been removed, or the first mask in the form of an oxide film formed by oxidizing a polysilicon film may be combined with the second mask in the form of a polysilicon film from which the oxide film of the first mask has been removed. As other examples, the first mask in the form of a polysilicon film may be combined with the second mask in the form of a polysilicon film from which an oxide film formed by oxidizing the first mask has been removed, or the first mask in the form of an oxide film formed by oxidizing a polysilicon film may be combined with the second mask in the form of an oxide film formed by oxidizing again the polysilicon film from which the oxide film of the first mask has been removed. In any case, the use of the first and second masks make it possible to produce a silicon carbide vertical MOS semiconductor device including two self-aligned impurity regions.

In a preferred form of the present invention, the manufacturing method further includes the step of implanting impurity ions in a selected region using a third mask. In this case, a silicon carbide vertical MOS semiconductor device including three self-aligned impurity regions can be produced.

According to another aspect of the present invention, there is provided a method for manufacturing a silicon carbide MOS semiconductor device, comprising the steps of: laminating a first conductivity type drift layer comprising silicon carbide, on a silicon carbide substrate; forming a second conductivity type base region in a selected portion of a surface layer of the first conductivity type drift layer, the second conductivity type base region comprising mutually spaced portions; forming a first conductivity type source region within the second conductivity type base region; forming a gate electrode layer on a gate insulating film, over a surface of the second conductivity type base region that is interposed between the first conductivity type source region and an exposed surface portion of the first conductivity type drift layer, the gate electrode layer comprising a polysilicon film; forming an interlayer insulating film on the gate electrode layer by thermally oxidizing the polysilicon film that provides the gate electrode layer; forming a source electrode in contact with surfaces of both of the first conductivity type source region and the second conductivity type base region; and forming a drain electrode on a rear surface of the silicon carbide substrate. In this method, the interlayer insulating film can be easily formed with high accuracy.

In a preferred form of the invention, an electrode contact region is provided by etching the entire area of an oxide film formed by thermally oxidizing the polysilicon film, thereby to remove a portion of the oxide film located on the silicon carbide substrate. Thus, the electrode contact region having a fine pattern can be easily formed, without requiring a special photolithography process for providing the electrode contact region.

According to a further aspect of the present invention, there is provided a silicon carbide MOS semiconductor device, which comprises: a first conductivity type drift layer comprising silicon carbide, which is laminated on a silicon carbide substrate; a second conductivity type base region formed in a selected portion of a surface layer of the first conductivity type drift layer, the second conductivity type base region comprising mutually spaced portions; a first conductivity type source region formed in the second conductivity type base region; a gate electrode layer formed on a gate insulating film, over a surface of the second conductivity type base region that is interposed between the first conductivity type source region and an exposed surface portion of the first conductivity type drift layer, the gate electrode layer comprising a polysilicon film; an interlayer insulating film formed by thermally oxidizing the polysilicon film of the gate electrode layer; a source electrode formed in contact with surfaces of both of the first conductivity type source region and the second conductivity type base region; and a drain electrode formed on a rear surface of the silicon carbide substrate. The silicon carbide vertical MOS semiconductor device having a finely dimensioned interlayer insulating layer can be easily produced, without requiring a special process step for forming the insulating layer.

BRIEF DESCRIPTION OF THE DRAWINGS

The invention will be described in greater detail with reference to a preferred embodiment thereof and the accompanying drawings, wherein.

DETAILED DESCRIPTION OF THE PREFERRED EMBODIMENT

One preferred embodiment of the present invention will be described in detail, though no description will be provided with respect to such portions that are identical with those of the known examples of FIGS. 4–7, or not related to the present invention. While an n channel MOSFET as one important application of the present invention will be illustrated by way of example, it is to be understood that this invention is equally applicable to p channel MOSFET having the reversed conductivity types. While numerous polytypes of silicon carbide are available, 6H—SiC and 4H—SiC are mainly employed in the following embodiment.

Figure 1:
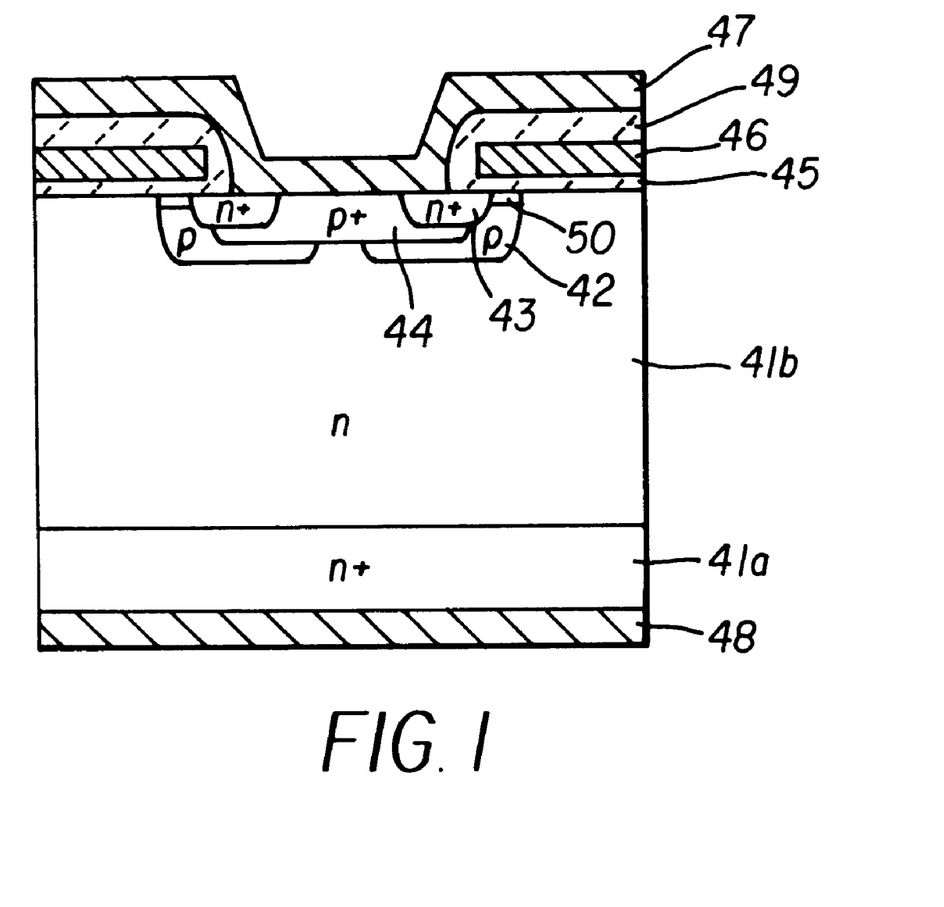
FIG. 1 is a cross-sectional view showing a part of a SiC vertical MOSFET according to one preferred embodiment of the present invention.

FIG. 1 is a cross-sectional view of a unit cell of SiC vertical MOSFET according to one preferred embodiment of the present invention.

In a wafer in which an n drift layer 41b is laminated on an n+ drift layer 41a, a p base region 42 is formed in a surface layer of the n drift layer 41b, and an n+ source region 43 is formed within the p base region 42. Also, a high concentration p+ well region 44 is formed to overlap the p base region 42. A gate electrode layer 46 made of polysilicon is formed on a gate oxide film 45, over the surface of the p base region 42 that is interposed between the n+ source region 43 and the exposed surface portion of the n drift layer 41b. A source electrode 47 is formed in contact with both the n+ source region 43 and the p+ well region 44, and a drain electrode 48 is formed on the rear surface of the n+ drain layer or substrate 41a. Reference numeral 49 denotes an interlayer insulating film in the form of a Si oxide film that insulates the gate electrode layer 46 and the source electrode 47 from each other.

The dimensions of the respective layers or regions of the above-described device are as follows: the n+ drain layer 41a has an impurity concentration of $1\times10^{18}$ cm$^{-3}$ and a thickness of 350 μm, and the n drift layer 41b has an impurity concentration of $1\times10^{16}$ cm$^{-3}$ and a thickness of 10 μm. The p base region 42 has a surface impurity concentration of $5\times10^{18}$ cm$^{-3}$, a junction depth of 1 μm, and a width of about 15 μm, and the n+ source region 43 has a surface impurity concentration of $1\times10^{19}$ cm$^{-3}$, a junction depth of 0.3 μm, and a width of about 5 μm. The p well region 44 has a surface impurity concentration of $1\times10^{19}$ cm$^{-3}$, a junction depth of 0.8 μm, and a width of about 10 μm. A channel region 50 has a length of about 1 μm. The thickness of the gate oxide film 75 is 50 nm, and the thickness of the gate electrode layer 46 is 1 μm, while the thickness of the interlayer insulating film 49 is 2 μm. The pitch of unit cells as shown in FIG. 1 is about 25 μm.

The SiC vertical MOSFET of the present embodiment is different from the known SiC vertical MOSFET device of FIG. 7 in that the p base region 42 and the n+ source region 43 are completely self-aligned, and the interlayer insulating film 49 on the gate electrode layer 46 consists of a Si oxide film. Its operation, however, is basically the same as that of the known example of FIG. 7. When a positive voltage is applied to the gate electrode layer 46, an inversion layer appears in the channel region 50, and current flows between the drain electrode 48 and the source electrode 47 that are now electrically connected to each other. When the voltage applied to the gate electrode layer 46 is removed, the current stops flowing between the drain and source electrodes 48, 47.

FIG. 2(a) through FIG. 2(g) and FIG. 3(a) through FIG. 3(f) are cross-sectional views showing the vicinity of the surface of the semiconductor substrate in the order of manufacturing steps, which views are useful in explaining a method for manufacturing the SiC vertical MOSFET of the present embodiment of FIG. 1.

Figure 2A:
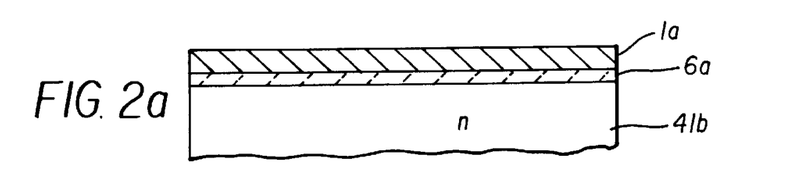
FIG. 2(a) through FIG. 2(g) are cross-sectional views showing the process steps for manufacturing the SiC vertical MOSFET of FIG. 1.

Initially, the n drift layer 41b doped with phosphorous is epitaxially grown on the n+ drain layer 41a, to provide a 4H—SiC substrate. For example, the n drift layer 41b has an impurity concentration of $1\times10^{16}$ cm$^3$ and a thickness of 10 μm. The surface of the n drift layer 41b is subjected to thermal oxidation at 1100° C. for 5 hours by a pyrogenic method, so that a thin buffer oxide film 6a having a thickness of about 30 nm is grown on the surface of the n drift layer 41b. Thereafter, a polysilicon film 1a having a thickness of 1.5 μm is deposited on the buffer oxide film 6a by low-pressure CVD method, as shown in FIG. 2(a). The buffer oxide film 6a is provided for detecting the depth of etching of the polysilicon film 1 in the next process step, so as to prevent the n drift layer 41b from being etched during this step. Thus, the buffer oxide film 6a may not be provided if any other measure is taken for preventing excessive etching. The thickness of the polysilicon film 1a is generally controlled to 1 to 2 μm. When the polysilicon film 1a is subjected to thermal oxidation in the later step, about 50% of the thickness of the resulting oxide film, for example, 0.5 μm where the thermal oxide film is 1 μm, is consumed, and therefore the initial thickness of the polysilicon film 1a is determined in view of this amount.

Figure 2B:
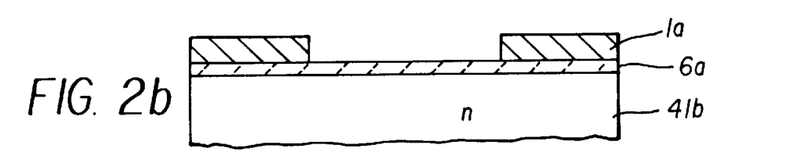

In the next step of FIG. 2(b), a pattern is formed by photolithography, and the polysilicon film 1a is etched by reactive ion etching (that will be referred to as "RIE") using mixed gases of carbon tetrachloride and oxygen.

Figure 2C:
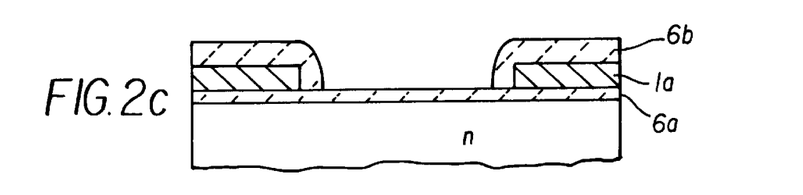

In the next step of FIG. 2(c), an oxide film 6b is formed by conducting thermal oxidation at 1100° C. for five hours by a pyrogenic method, so as to provide a first mask M1. What should be noted in this step is that the oxidizing rate of the polysilicon film 1a is greatly different from that of the SiC substrate, and only an extremely thin oxide film is grown on the SiC substrate. Under the above conditions, for example, the oxide film of the polysilicon film 1a has a thickness of 1 μm or larger, while the oxide film of SiC has a thickness of about 30 nm. Furthermore, a considerably small increase in the film thickness is observed in a portion of the SiC substrate on which the buffer oxide film 6a is formed.

Figure 2D:
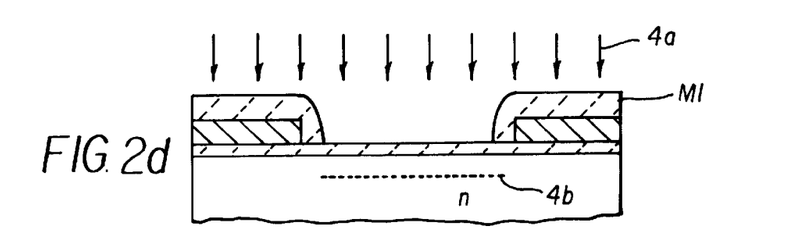

In the next step of FIG. 2(d), aluminum (Al) ions 4a for forming the $p^+$ well region 44 are implanted at a high temperature of 1000° C. In FIG. 2(d), reference numeral 4b denotes aluminum atoms thus implanted. Here, multiple implantation is performed at an acceleration voltage of 30 KeV to 1 MeV, and the total dose amount is $1 \times 10^{14}$ to $5 \times 10^{15}$ cm$^{-2}$. Boron ions may be implanted instead of aluminum ions. Although the implantation may be conducted at room temperature, it is desirable to carry out the ion implantation at a high temperature for improvement of the activation rate of the implanted ions.

Figure 2E:
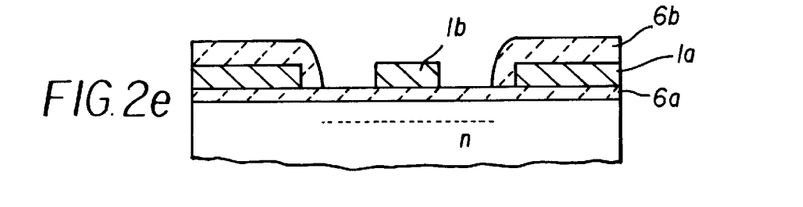

In the next step of FIG. 2(e), a polysilicon film 1b is deposited again by low-pressure CVD method, and a pattern is formed by photolithography in the central portion of the substrate in which aluminum ions have been implanted.

Figure 2F:
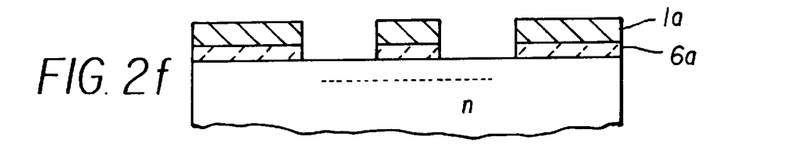

In the next step of FIG. 2(f), wet etching is carried out so as to remove the oxide film 6b on the polysilicon film 1a and the buffer oxide film 6a on a portion of the SiC substrate that is surrounded by the polysilicon films 1a, 1b. As a result, the patterns of the polysilicon films 1a and 1b remain on the SiC substrate. The above-described step of re-depositing and patterning the polysilicon film 1b and this step of removing the thermal oxide films may be reversed in order. In this case, however, the second polysilicon film 1b directly contacts with the SiC substrate, and may cause the problem of excessive etching as described above. It is thus preferable to pattern the polysilicon film 1b while the thermal oxide film is present on the SiC substrate.

Figure 2G:
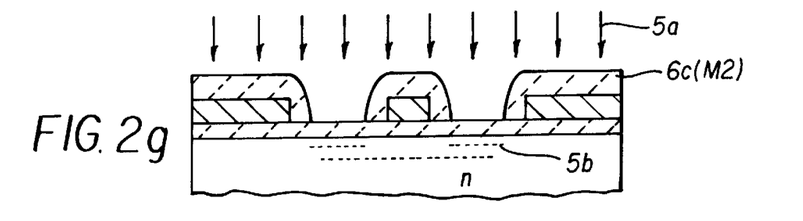

In the next step of FIG. 2(g), an oxide film 6c is formed by conducting thermal oxidation again at 1100° C. for five hour by a pyrogenic method, so as to provide a second mask M2, and nitrogen (N) ions 5a for forming the $n^+$ source region 43 are implanted at a high temperature of about 1000° C. In FIG. 2(g), reference numeral 5b denotes nitrogen atmos thus implanted. In this ion implantation step, the acceleration voltage is 30 to 400 keV, and the total dose amount is about $5 \times 10^{15}$ cm$^{-3}$. Other than nitrogen, phosphorous (P) may be used as n type impurities. The activate rate of the implanted ions can be improved by carrying out the ion implantation at a high temperature. Since the thermal oxide film 6b formed by oxidizing the first polysilicon film 1a has been removed, the edge of the second mask M2 is retracted from or located behind the edge of the first mask M1 used when implanting aluminum ions in the step of FIG. 2(d), by an amount that was consumed as the oxide film.

Figures 3A, 3B:
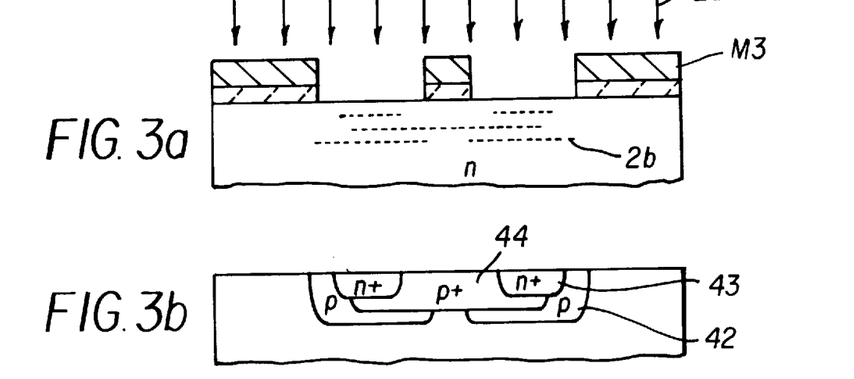
FIG. 3(a) through FIG. 3(f) are cross-sectional views showing the process steps following that of FIG. 2(g), for manufacturing the SiC vertical MOSFET of FIG. 1.

In the step of FIG. 3(a), the thermal oxide film of the second mask M2 is removed, and boron (B) ions 2a, as an example of p type impurities, are implanted using the remaining polysilicon films as a third mask M3. In FIG. 3(a), reference numeral 2b denotes boron (B) atoms thus introduced for forming the p base region 42. The implantation is conducted at an acceleration voltage of 30 keV to 1 MeV, and the total dose amount is about $1 \times 10^{14}$ cm$^{-2}$. Other than boron (B), aluminum (Al) may be used as p type impurities. In this step, the ions can be implanted for forming the p base region 42 outwardly of the $n^+$ source region 43, by an amount corresponding to the oxide film 6c that has been removed.

Subsequently, the polysilicon films 1a, 1b that provide the third mask M3, and the buffer oxide films 6a under the films 1a, 1b are removed, and heat treatment is conducted at 1650° C. for one hour, so as to activate the impurities thus implanted. As a result, the p base region 42, $n^+$ source region 43, and $p^+$ well region 44 are formed as shown in FIG. 3(b). Although the impurities hardly diffuse in the SiC substrate, as described above, the depth to which each impurity region is formed can be controlled by suitably adjusting the acceleration voltage during the ion implantation. For example, the p base region 42 is formed with a junction depth of 1.0 μm, by setting the maximum acceleration voltage to as high as 1 MeV. The junction depth of the $n^+$ source region 43 is 0.3 μm. While the maximum depth of the $p^+$ well region is 0.8 μm, the larger depth may be achieved by further increasing the acceleration voltage.

Figure 3C:
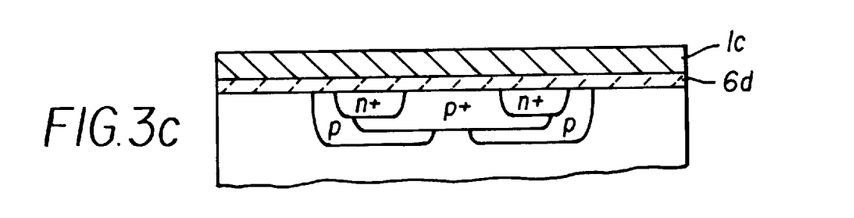

In the step of FIG. 3(c), an oxide film 6d that has a thickness of 30 nm and provides the gate oxide film 45 is formed by conducting thermal oxidation at 1100° C. for five hours by a pyrogenic method. Thereafter, a third polysilicon film 1c having a thickness of 1 μm is deposited by low-pressure CVD method.

Figure 3D:
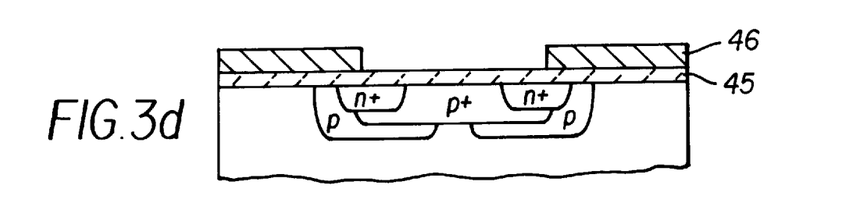
Figure 3E:
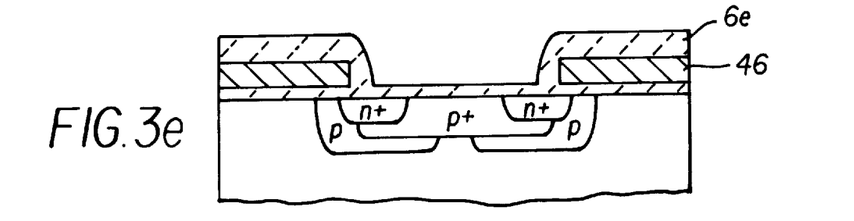

In the next step of FIG. 3(d), the third polysilicon film 1c is patterned by photolithography, to provide the gate electrode layer 46. Then, thermal oxidation is conducted at 1100° C. for five hours by a pyrogenic method, so as to form an oxide film 6e on the polysilicon film 1c and the surface of the SiC substrate, as shown in FIG. 3(e).

Figure 3F:
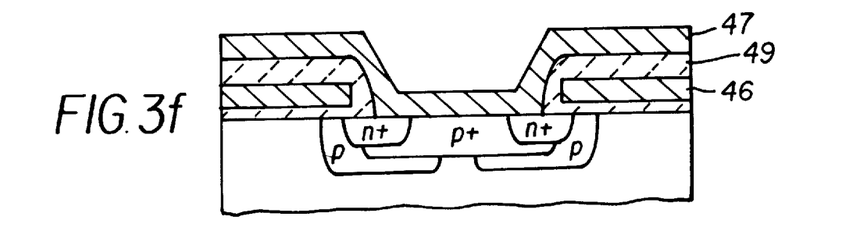

The entire area of the oxide film 6e is subjected to wet etching or dry etching so that only a portion of the oxide film 6e that lies on the SiC substrate is removed, thus exposing an electrode contact portion to the outside. The polysilicon film 1c remains covered by the thick oxide film 6e. Thus, a contact hole that permits contact with an electrode is automatically formed without patterning by photolithography. Of course, an opening needs to be formed through the oxide film 6e through separate patterning, so as to allow the polysilicon film 1c of the gate electrode layer 46 to contact with the metal gate electrode, highly accurate or fine patterning is not required in this step. The oxide film 6e formed on and along the side of the gate electrode layer 46 provides the interlayer insulating film 49. After forming the contact hole, an aluminum alloy film is deposited, and patterned, as shown in FIG. 3(f), so as to provide the source electrode 47 and gate electrode (not illustrated).

After the step of FIG. 2(f), the drain electrode is formed on the rear surface of the $n^+$ substrate, and the whole process is completed.

By employing the manufacturing method as described above, the high voltage SiC vertical MOSFET as shown in FIG. 1 can be produced.

In the SiC vertical MOSFET of the present embodiment, the $p^+$ well region 44 is defined by the first mask M1 obtained by thermally oxidizing the polysilicon film 1a, utilizing the pattern of the polysilicon film 1a formed in the step of FIG. 2(b), and the oxide film is once removed. The $n^+$ source region 43 is then defined by the second mask M2 obtained by thermally oxidizing the polysilicon film 1a again, and the p base region 42 is defined by the third mask M3 of the polysilicon film from which the oxide film was removed. Thus, complete self alignment can be achieved in the process of the present embodiment. Since the respective regions are self-aligned, the resulting device does not suffer from a problem of non-uniformity due to variations in the position of masks.

The length of the channel region 50 is one of principal parameters that determine the characteristics of MOSFET, and it is therefore extremely important in its applications to control the length of the channel region 50 with sufficiently high accuracy. In the SiC vertical MOSFET of the illustrated embodiment, the length of the channel region 50 as a spacing between the p base region 42 and the $n^+$ source region 43 can be controlled with high accuracy to be uniform and sufficiently small, thus assuring stable characteristics of the MOSFET and a high yield in the manufacture thereof.

In the known device, two masks need to be used, and the length of the channel that can be uniformly formed in a wide area is about 3 $\mu$m. According to the present invention, a SiC vertical MOSFET having a channel length of 1 $\mu$m can be realized. Consequently, the channel resistance is reduced to one-third of that of the known device, and the ON resistance of a 1500V-class MOSFET fabricated according to the invention was as low as 15 m$\Omega\cdot$cm$^{-2}$.

In the illustrated embodiment, the p base region 42 is formed by implanting ions at a high acceleration voltage to increase the junction depth, whereby a high breakdown voltage of 1500V or higher can be easily achieved.

The above-described manufacturing method may be modified in several ways. For example, the ion implantation step of FIG. 3(a) for forming the p base region 42 and the ion implantation step of FIG. 2(g) for forming the $n^+$ source region 43 may be reversed in order. These steps may also be successively carried out. This is because the implantation depth of the $n^+$ source region 43 is about 0.3 $\mu$m, while that of the p base region 42 is normally as large as 1 $\mu$m or larger, and therefore the lateral expansion of implantation for the p base region 42 becomes larger than that for the $n^+$ source region 43. If the ion implantation can be performed at a much lower temperature than 1000° C., the mask material may be selected from a wider range of choice.

The process steps up to that of FIG. 3(b) are independent of the process steps following that of FIG. 3(b), and only one group of the process steps may be employed, rather than employing both groups of process steps.

While SiC vertical MOSFET has been illustrated by way of example in the above embodiment, the present invention may be equally applied to voltage driven type MOS power devices, such as IGBT and MOS thyristors. The same technique may also be applied to lateral MOSFET.

In the method for manufacturing SiC MOS semiconductor devices according to the present invention as described above, respective self-aligned impurity regions are formed utilizing a shift or movement of the edge of the mask (or a difference in the position between the edges of the two masks) due to oxidation of the polysilicon film or removal of its oxide film. It is thus possible to produce a silicon carbide MOS semiconductor devices having finely controlled channel regions formed by self alignment. This leads to a remarkable effect of reducing the ON resistance.

Namely, the self-alignment technique similar to that employed for Si devices can be applied to SiC devices, to achieve a uniform channel length of, for example, 1 $\mu$m, as indicated in the illustrated embodiment, with the result of a significant reduction in the channel resistance.

Also, an interlayer insulating film is formed by thermally oxidizing a polysilicon film that provides the gate electrode layer of the SiC MOS semiconductor device. This makes it possible to form a contact hole with high accuracy by a simple process.

The method of the present invention is quite effectively employed not only for manufacturing discrete MOSFETs, but also for manufacturing CMOS-IC and other SiC semiconductor devices. Thus, SiC semiconductor devices having a high breakdown voltage and a reduced loss can be easily produced according to the present invention.

What is claimed is:

1. A method for manufacturing a silicon carbide MOS semiconductor device, comprising the steps of:

laminating a first conductivity type drift layer comprising silicon carbide, on a silicon carbide substrate;

forming a second conductivity type base region in a selected portion of a surface layer of said first conductivity type drift layer, using a first mask, said second conductivity type base region comprising mutually spaced portions;

forming a first conductivity type source region in a selected portion of said second conductivity type base region, using a second mask;

forming a gate electrode layer on a gate insulating film, over a surface of said second conductivity type base region that is interposed between said first conductivity type source region and an exposed surface portion of said first conductivity type drift layer;

forming a source electrode in contact with surfaces of both of said first conductivity type source region and said second conductivity type base region; and forming a drain electrode on a rear surface of said silicon carbide substrate;

wherein each of said first mask and said second mask used for forming said second conductivity type base region and said first conductivity type source region, respectively, comprises a polysilicon film or an oxide film thereof, said second conductivity type base region and said first conductivity type source region being positioned with respect to each other, utilizing a difference in the position of edges of said first and second masks due to oxidation or removal of the oxide film.

2. A method for manufacturing a silicon carbide MOS semiconductor device, comprising the steps of:

laminating a first conductivity type drift layer comprising silicon carbide, on a silicon carbide substrate;

forming a second conductivity type base region in a selected portion of a surface layer of said first conductivity type drift layer, said second conductivity type base region comprising mutually spaced portions;

forming a first conductivity type source region within said second conductivity type base region;

forming a gate electrode layer on a gate insulating film, over a surface of said second conductivity type base region that is interposed between said first conductivity type source region and an exposed surface portion of said first conductivity type drift layer;

forming a source electrode in contact with surfaces of both of said first conductivity type source region and said second conductivity type base region; and forming a drain electrode on a rear surface of said silicon carbide substrate;

wherein different impurity regions that are self-aligned with respect to each other are formed by executing at least two of ion implantation steps, which include ion implantation using a pattern of a polysilicon film as a mask; ion implantation using, as a mask, a pattern of an oxide film formed by oxidizing the patterned polysilicon film; ion implantation using, as a mask, a pattern of a polysilicon film from which an oxide film as a result of oxidation of the patterned polysilicon film has been removed; and ion implantation using, as a mask, a pattern of a polysilicon film or an oxide film of the polysilicon film for which oxidation and removal of an oxide film have been repeated.

3. A method for manufacturing a silicon carbide MOS semiconductor device, comprising the steps of:

epitaxially growing a first conductivity type drift layer comprising silicon carbide, on a silicon carbide substrate, to provide a silicon carbide substrate;

forming a first mask comprising a first polysilicon film on a surface of said first conductivity type drift layer, and implanting impurity ions in a selected portion of the first conductivity type drift layer, using said first mask;

forming a second mask comprising an oxide film formed by oxidizing said first mask, and implanting impurity ions in a selected portion of the first conductivity type drift layer, using said second mask;

removing said first mask and said second mask;

conducting heat treatment for activating implanted impurities;

forming a gate oxide film on a surface of said silicon carbide substrate through thermal oxidation;

depositing a second polysilicon film on said gate oxide film and then patterning the second polysilicon film to provide a gate electrode layer;

covering said second polysilicon film with an insulating film;

forming a contact hole through said insulating film, and vapor-depositing a metallic film so as to provide a gate electrode that contacts with said second polysilicon film; and forming a source electrode in contact with a surface of at least one of impurity regions formed by ion implantation, and forming a drain electrode in contact with said silicon carbide substrate.

4. A method for manufacturing a silicon carbide MOS semiconductor device, comprising the steps of:

epitaxially growing a first conductivity type drift layer comprising silicon carbide, on a silicon carbide substrate, to provide a silicon carbide substrate;

forming a first mask comprising a first polysilicon film on a surface of said first conductivity type drift layer, and implanting impurity ions in a selected portion of the first conductivity type drift layer, using said first mask;

oxidizing said first polysilicon film of said first mask to provide an oxide film, forming a second mask comprising the first polysilicon film from which the oxide film has been removed, and implanting impurity ions in a selected portion of the first conductivity type drift layer, using said second mask;

removing said first mask and said second mask;

conducting heat treatment for activating implanted impurities;

forming a gate oxide film on a surface of said silicon carbide substrate through thermal oxidation;

depositing a second polysilicon film on said gate oxide film and then patterning the second polysilicon film to provide a gate electrode layer;

covering said second polysilicon film with an insulating film;

forming a contact hole through said insulating film, and vapor-depositing a metallic film so as to provide a gate electrode that contacts with said second polysilicon film; and forming a source electrode in contact with a surface of at least one of impurity regions formed by ion implantation, and forming a drain electrode in contact with said silicon carbide substrate.

5. A method for manufacturing a silicon carbide MOS semiconductor device, comprising the steps of:

epitaxially growing a first conductivity type drift layer comprising silicon carbide, on a silicon carbide substrate, to provide a silicon carbide substrate;

forming a first mask comprising an oxide film formed by oxidizing a first polysilicon film deposited on a surface of said first conductivity type drift layer, and implanting impurity ions in a selected portion of the first conductivity type drift layer, using said first mask;

forming a second mask comprising said first polysilicon film from which said oxide film has been removed, and implanting impurity ions in a selected portion of the first conductivity type drift layer, using said second mask;

removing said first mask and said second mask;

conducting heat treatment for activating implanted impurities;

forming a gate oxide film on a surface of said silicon carbide substrate through thermal oxidation;

depositing a second polysilicon film on said gate oxide film and then patterning the second polysilicon film to provide a gate electrode layer;

covering said second polysilicon film with an insulating film;

forming a contact hole through said insulating film, and vapor-depositing a metallic film so as to provide a gate electrode that contacts with said second polysilicon film; and forming a source electrode in contact with a surface of at least one of impurity regions formed by ion implantation, and forming a drain electrode in contact with said silicon carbide substrate.

6. A method for manufacturing a silicon carbide MOS semiconductor device, comprising the steps of:

epitaxially growing a first conductivity type drift layer comprising silicon carbide, on a silicon carbide substrate, to provide a silicon carbide substrate;

forming a first mask comprising a first polysilicon film deposited on a surface of said first conductivity type drift layer, and implanting impurity ions in a selected portion of the first conductivity type drift layer, using said first mask;

oxidizing said first polysilicon film of said first mask to provide an oxide film, forming a second mask comprising the first polysilicon film from which the oxide film has been removed, and implanting impurity ions in a selected portion of the first conductivity type drift layer, using said second mask;

removing said first mask and said second mask;

conducting heat treatment for activating implanted impurities;

forming a gate oxide film on a surface of said silicon carbide substrate through thermal oxidation;

depositing a second polysilicon film on said gate oxide film and then patterning the second polysilicon film to provide a gate electrode layer;

covering said second polysilicon film with an insulating film;

forming a contact hole through said insulating film, and vapor-depositing a metallic film so as to provide a gate electrode that contacts with said second polysilicon film; and forming a source electrode in contact with a surface of at least one of impurity regions formed by ion implantation, and forming a drain electrode in contact with said silicon carbide substrate.

7. A method for manufacturing a silicon carbide MOS semiconductor device, comprising the steps of:

epitaxially growing a first conductivity type drift layer comprising silicon carbide, on a silicon carbide substrate, to provide a silicon carbide substrate;

forming a first mask comprising a first oxide film formed by oxidizing a first polysilicon film deposited on a surface of said first conductivity type drift layer, and implanting impurity ions in a selected portion of the first conductivity type drift layer, using said first mask;

forming a second mask comprising a second oxide film formed by oxidizing the first polysilicon film from which said first oxide film has been removed, and implanting impurity ions in a selected portion of the first conductivity type drift layer, using said second mask;

removing said first mask and said second mask;

conducting heat treatment for activating implanted impurities;

forming a gate oxide film on a surface of said silicon carbide substrate through thermal oxidation;

depositing a second polysilicon film on said gate oxide film and then patterning the second polysilicon film to provide a gate electrode layer;

covering said second polysilicon film with an insulating film;

forming a contact hole through said insulating film, and vapor-depositing a metallic film so as to provide a gate electrode that contacts with said second polysilicon film; and forming a source electrode in contact with a surface of at least one of impurity regions formed by ion implantation, and forming a drain electrode in contact with said silicon carbide substrate.

8. A method for manufacturing silicon carbide MOS semiconductor device according to claim 3, further comprising the step of forming a third mask on the surface of said first conductivity type drift layer, and implanting impurity ions in a selected portion of the first conductivity type drift layer, using said third mask.

9. A method for manufacturing a silicon carbide MOS semiconductor device, comprising the steps of:

laminating a first conductivity type drift layer comprising silicon carbide, on a silicon carbide substrate;

forming a second conductivity type base region in a selected portion of a surface layer of said first conductivity type drift layer, said second conductivity type base region comprising mutually spaced portions;

forming a first conductivity type source region within said second conductivity type base region;

forming a gate electrode layer on a gate insulating film, over a surface of said second conductivity type base region that is interposed between said first conductivity type source region and an exposed surface portion of said first conductivity type drift layer, said gate electrode layer comprising a polysilicon film;

forming an interlayer insulating film on said gate electrode layer by thermally oxidizing the polysilicon film that provides the gate electrode layer;

forming a source electrode in contact with surfaces of both of said first conductivity type source region and said second conductivity type base region; and forming a drain electrode on a rear surface of said silicon carbide substrate.

10. A method for manufacturing a silicon carbide MOS semiconductor device according to claim 3, further comprising the step of forming an interlayer insulating film on said gate electrode layer, by thermally oxidizing said second polysilicon film that provides the gate electrode layer.

11. A method for manufacturing a silicon carbide MOS semiconductor device according to claim 1, further comprising the step of forming an electrode contact region by etching an entire surface of an oxide film formed by thermally oxidizing the polysilicon film, so as to remove a portion of the oxide film that is located on said silicon carbide substrate.

12. A method for manufacturing silicon carbide MOS semiconductor device according to claim 4, further comprising the step of forming a third mask on the surface of said first conductivity type drift layer, and implanting impurity ions in a selected portion of the first conductivity type drift layer, using said third mask.

13. A method for manufacturing silicon carbide MOS semiconductor device according to claim 5, further comprising the step of forming a third mask on the surface of said first conductivity type drift layer, and implanting impurity ions in a selected portion of the first conductivity type drift layer, using said third mask.

14. A method for manufacturing silicon carbide MOS semiconductor device according to claim 6, further comprising the step of forming a third mask on the surface of said first conductivity type drift layer, and implanting impurity ions in a selected portion of the first conductivity type drift layer, using said third mask.

15. A method for manufacturing silicon carbide MOS semiconductor device according to claim 7, further comprising the step of forming a third mask on the surface of said first conductivity type drift layer, and implanting impurity ions in a selected portion of the first conductivity type drift layer, using said third mask.

16. A method for manufacturing a silicon carbide MOS semiconductor device according to claim 2, further comprising the step of forming an electrode contact region by etching an entire surface of an oxide film formed by thermally oxidizing the polysilicon film, so as to remove a portion of the oxide film that is located on said silicon carbide substrate.

17. A method for manufacturing a silicon carbide MOS semiconductor device according to claim 3, further comprising the step of forming an electrode contact region by etching an entire surface of an oxide film formed by thermally oxidizing the polysilicon film, so as to remove a portion of the oxide film that is located on said silicon carbide substrate.

18. A method for manufacturing a silicon carbide MOS semiconductor device according to claim 4, further comprising the step of forming an electrode contact region by etching an entire surface of an oxide film formed by thermally oxidizing the polysilicon film, so as to remove a portion of the oxide film that is located on said silicon carbide substrate.

19. A method for manufacturing a silicon carbide MOS semiconductor device according to claim 5, further comprising the step of forming an electrode contact region by etching an entire surface of an oxide film formed by thermally oxidizing the polysilicon film, so as to remove a portion of the oxide film that is located on said silicon carbide substrate.

20. A method for manufacturing a silicon carbide MOS semiconductor device according to claim 6, further comprising the step of forming an electrode contact region by etching an entire surface of an oxide film formed by thermally oxidizing the polysilicon film, so as to remove a portion of the oxide film that is located on said silicon carbide substrate.

21. A method for manufacturing a silicon carbide MOS semiconductor device according to claim 7, further comprising the step of forming an electrode contact region by etching an entire surface of an oxide film formed by thermally oxidizing the polysilicon film, so as to remove a portion of the oxide film that is located on said silicon carbide substrate.

22. A method for manufacturing a silicon carbide MOS semiconductor device according to claim 9, further comprising the step of forming an electrode contact region by etching an entire surface of an oxide film formed by thermally oxidizing the polysilicon film, so as to remove a portion of the oxide film that is located on said silicon carbide substrate.

23. A method for manufacturing a silicon carbide MOS semiconductor device according to claim 4, further comprising the step of forming an interlayer insulating film on said gate electrode layer, by thermally oxidizing said second polysilicon film that provides the gate electrode layer.

24. A method for manufacturing a silicon carbide MOS semiconductor device according to claim 5, further comprising the step of forming an interlayer insulating film on said gate electrode layer, by thermally oxidizing said second polysilicon film that provides the gate electrode layer.

25. A method for manufacturing a silicon carbide MOS semiconductor device according to claim 6, further comprising the step of forming an interlayer insulating film on said gate electrode layer, by thermally oxidizing said second polysilicon film that provides the gate electrode layer.

26. A method for manufacturing a silicon carbide MOS semiconductor device according to claim 7, further comprising the step of forming an interlayer insulating film on said gate electrode layer, by thermally oxidizing said second polysilicon film that provides the gate electrode layer.

* * * * *